United States Patent
Shi (10) Patent No.: US 12,123,088 B2
(45) Date of Patent: Oct. 22, 2024

(54) TEMPERATURE RESISTANT CARBON COATINGS

(71) Applicant: Nanofilm Technologies International Limited, Singapore (SG)

(72) Inventor: Xu Shi, Singapore (SG)

(73) Assignee: Nanofilm Technologies International Limited, Singapore (SG)

( * ) Notice: Subject to any disclaimer, the term of this patent is extended or adjusted under 35 U.S.C. 154(b) by 549 days.

(21) Appl. No.: 17/291,380

(22) PCT Filed: Nov. 7, 2019

(86) PCT No.: PCT/EP2019/080620
§ 371 (c)(1),
(2) Date: May 5, 2021

(87) PCT Pub. No.: WO2020/094817
PCT Pub. Date: May 14, 2020

(65) Prior Publication Data
US 2022/0002861 A1    Jan. 6, 2022

(30) Foreign Application Priority Data
Nov. 8, 2018    (EP) .................................... 18205138

(51) Int. Cl.
*C23C 14/06*    (2006.01)
*C23C 14/02*    (2006.01)
(Continued)

(52) U.S. Cl.
CPC ........ *C23C 14/0605* (2013.01); *C23C 14/021* (2013.01); *C23C 14/024* (2013.01);
(Continued)

(58) Field of Classification Search
CPC .............. C23C 14/0605; C23C 14/024; C23C 14/0635; C23C 14/325; C23C 14/0652; C23C 14/0641; C23C 14/35
(Continued)

(56) References Cited

U.S. PATENT DOCUMENTS

2011/0140367 A1* 6/2011 Shi .................. C23C 14/025
                                                    204/192.1
2016/0076141 A1    3/2016 Hirota

FOREIGN PATENT DOCUMENTS

CN    1654702 A  *  8/2005
CN    106637207 A  *  5/2017
(Continued)

OTHER PUBLICATIONS

Machine_English_translation_JP_2010116295_A; Hashimoto, S.; Mold for Molding optical element and method for manufacturing the same; May 27, 2010; EPO; whole document (Year: 2023).*
(Continued)

*Primary Examiner* — Tahseen Khan
(74) *Attorney, Agent, or Firm* — Sterne, Kessler, Goldstein & Fox P.L.L.C.

(57) ABSTRACT

The invention provides a substrate coated with a multi-layer coating, comprising in order: (a) the substrate; (b) a thermally insulating layer (e.g. $Si_3N_4$); (c) an interfacial layer (e.g. SiC); and (d) one or more layers comprising ta-C; wherein the interfacial layer promotes adhesion of the one or more layers comprising ta-C to the thermally insulating layer; and methods for producing such coatings.

14 Claims, 2 Drawing Sheets

(51) Int. Cl.
  *C23C 14/32* (2006.01)
  *C23C 14/35* (2006.01)
(52) U.S. Cl.
  CPC ...... *C23C 14/0635* (2013.01); *C23C 14/0641* (2013.01); *C23C 14/0652* (2013.01); *C23C 14/325* (2013.01); *C23C 14/35* (2013.01)
(58) Field of Classification Search
  USPC ........................................................ 428/216
  See application file for complete search history.

(56) References Cited

FOREIGN PATENT DOCUMENTS

| | | | | |
|---|---|---|---|---|
| JP | 2010116295 A | * | 5/2010 | ........... C03B 11/086 |
| JP | 2011098845 A | | 5/2011 | |
| WO | WO-2007020138 A1 | * | 2/2007 | ........... C23C 28/044 |
| WO | WO-2017011315 A2 | | 1/2017 | |
| WO | WO-2018112912 A1 | * | 6/2018 | ............. B32B 27/14 |

OTHER PUBLICATIONS

Machine_English_translation_CN_106637207_A; Shi, Xu; Method for coating high temperature resistant diamond on graphite substrate; May 10, 2017; EPO; whole document (Year: 2023).*

Machine_English_translation_WO_2018112912_A1; Chen, C.; et. al.; Cutter Composite Coating, Cutter, and Method for Preparing Cutter Composite Coating; Jun. 28, 2018; EPO; whole document (Year: 2023).*

Machine English translation_CN_1654702a; Wu, et al.; High oxidation resistance nanocrystalline-amorphous structured superhard composite film cutting tool and deposition method therefor; Aug. 17, 2005; EPO; whole document (Year: 2024).*

Bernhardt, F., et al., "Development of a ta-C diamond-like carbon (DLC) coating by magnetron sputtering for use in precision glass molding," *Materialwissenschaft Und Werkstofftechnik (Materials Science & Engineering Technology)* 44(8):661-666, Wiley-VCH GmbH, Germany (2013).

Neuville, S., "New application perspective for tetrahedral amorphous carbon coatings," QScience Connect 2014(1):1-27, Hamad Bin Khalifa University Press, Qatar (2014).

Co-pending Application, U.S. Appl. No. 17/283,590, inventors Shi, X., et al., International Filing Date: Oct. 8, 2019 (Not yet Published).

Co-pending Application, U.S. Appl. No. 17/291,378, inventors Shi, X., et al., International Filing Date: Nov. 7, 2019 (Not yet Published).

Co-pending Application, U.S. Appl. No. 17/414,843, inventors Shi, X., et al., International Filing Date: Dec. 17, 2019 (Not yet Published).

* cited by examiner

TEMPERATURE RESISTANT CARBON COATINGS

INTRODUCTION

This present invention relates to improved carbon coatings which are resistant to and stable at high temperatures and methods for producing such coatings.

BACKGROUND TO THE INVENTION

A large variety of deposition techniques are used to coat substrates. Vapor deposition technology is typically used to form thin film deposition layers in various types of applications, including microelectronic applications and heavy-duty applications. Such deposition technology can be classified in two main categories. A first category of such deposition technology is known as Chemical Vapor Deposition (CVD). CVD generally refers to deposition processes occurring due to a chemical reaction. Common examples of CVD processes include semiconducting Si layer deposition, epitaxy and thermal oxidation.

A second category of deposition is commonly known as Physical Vapor Deposition (PVD). PVD generally refers to the deposition of solid substances occurring as a result of a physical process. The main concept underlying the PVD processes is that the deposited material is physically transferred onto the substrate surface via direct mass transfer. Typically, no chemical reaction takes place during the process and the thickness of the deposited layer is independent of chemical reaction kinetics as opposed to CVD processes.

Sputtering is a known physical vapor deposition technique for depositing compounds on a substrate, wherein atoms, ions or molecules are ejected from a target material (also called the sputter target) by particle bombardment so that the ejected atoms or molecules accumulate on a substrate surface as a thin film.

Another known physical vapor deposition technique is cathodic vapor arc deposition methods. In this method, an electric arc is used to vaporize material from a cathode target. Consequently, the resulting vaporized material condenses on a substrate to form a thin film of coating.

Amorphous carbon is a free, reactive form of carbon which does not have a crystalline form. Various forms of amorphous carbon films exist and these are usually categorised by the hydrogen content of the film and the $sp^2:sp^3$ ratio of the carbon atoms in the film.

In an example of the literature in this field, amorphous carbon films are categorised into 7 categories (see table below taken from "Name Index of Carbon Coatings" from Fraunhofer Institut Schich- and Oberflächentechnik):

Tetrahedral hydrogen-free amorphous carbon (ta-C) is characterised in that it contains little or no hydrogen (less than 5% mol, typically less than 2% mol) and a high content of $sp^3$ hybridised carbon atoms (typically greater than 80% of the carbon atoms being in the $sp^3$ state).

Whilst the term "diamond-like carbon" (DLC) is sometimes used to refer to all forms of amorphous carbon materials, the term as used herein refers to amorphous carbon materials other than ta-C. Common methods of DLC manufacture use hydrocarbons (such as acetylene), hence introducing hydrogen into the films (in contrast to ta-C films in which the raw material is typically hydrogen free high purity graphite).

In other words, DLC typically has an $sp^2$ carbon content of greater than 50% and/or a hydrogen content of 20% mol and above. The DLC may be undoped or doped with metals or non-metals (see table above).

Diamond-Like Carbon (DLC) coatings have high hardness values and low friction coefficients and are therefore useful as wear-resistant coatings. To date, DLC coatings have been widely used in cutting tools, automotive engine parts and other fields. However, in some fields, the coatings are required to maintain good wear resistance at high temperatures. However, for these applications, conventional diamond-like carbon coatings do not meet these requirements. In particular, hydrogenated DLCs are typically unstable at higher temperatures as they emit hydrogen gas.

Temperature resistant carbon coatings would be particularly useful for coating moulds used in the manufacture of glass lenses. Whilst symmetric lenses can be formed by grinding, asymmetric lenses are typically moulded from softened glass. The moulds must be able to withstand high temperatures (e.g. 600-700° C.) and their shape and size should be temperature independent (i.e. the mould should not expand and contract as the temperature of the mould increases and decreases). Currently, tungsten carbide moulds are used for this purpose. However, these moulds have a limited lifetime.

Similarly, in the production of curved mobile phone screens, currently graphite moulds are used to press the softened glass material under high-temperature anoxic (such as nitrogen) environments. This current process has the disadvantage that the graphite moulds have a short life span (usually in the environment of 650° C., the number of products that can be pressed is very limited). In addition to this, the yield is low. Since graphite itself is a relatively loose material, graphite "dust" may gather on the graphite moulds. Even if the surface of the mould is polished, during the pressing process, over time the surface of the glass is stained

| Amorphous Carbon Films | | | | | | |
|---|---|---|---|---|---|---|
| Hydrogen-Free | | | Hydrogenated | | | |
| | | Modified | | | Modified with | |
| Unmodified | | With metals | Unmodified | | Metals | Non-metals |
| $sp^2$ | $sp^3$ | $sp^2$ | $sp^2$ or $sp^3$ | $sp^3$ | $sp^2$ | $sp^2$ |
| Hydrogen-free amorphous carbon | Tetrahedral, hydrogen-free amorphous carbon | Metal-containing, hydrogen-free amorphous carbon | Hydrogenated amorphous carbon | Tetrahedral, hydrogenated amorphous carbon | Metal-containing, hydrogenated amorphous carbon | Non-metal containing hydrogenated amorphous carbon |
| a-C | ta-C | a-C:Me | a-C:H | ta-C:H | a-C:H:Me | a-C:H:X | with graphite "dust" particles. In order to increase the hardness of the screens, the pressing temperature of some curved screens has been raised to 850-900° C. At this temperature, the lifetime of the graphite moulds decreases further. As a result of these problems and associated the high cost of this process, the application and cost of producing curved mobile phone screens is greatly affected.

WO 2007/020138 refers to a coated substrate comprising a substrate, an intermediate layer and a tetrahedral carbon layer where the Young's modulus of the tetrahedral carbon layer must be greater than that of the intermediate layer.

JP 2010 116295 discloses a multi-layered coating for a glass mould.

WO 2017/011315 discloses a glass mould with an encapsulating coating that has a low coefficient of thermal expansion.

Bernhardt et al, "Development of a ta-C diamond-like carbon (DLC) coating by magnetron sputtering for use in precision glass molding", Materialwissenschaft Und Werstofftechnik, vol. 44, no. 8, (2013), p. 661-666 teaches of using DLC as a coating for a glass moulding system.

Carbon coatings that are stable at high temperatures could also be used on thermal heads for thermal printers. At present, thermal printing heads are coated with thin films that allow the transfer of heat from the printer to the paper. However, a common problem with existing thermal printing heads is that the coatings wear quickly and therefore require frequent replacement. A more wear-resistant coating would reduce this problem.

There therefore exists the need for hard, carbon coatings which are not easily damaged and are resistant to and stable at high temperatures (e.g. in excess of 400° C., preferably also in excess of 600° C.), for example for use on moulds for lens production or thermal printing heads.

The Invention

The inventor of the present application has developed a temperature resistant coating with various applications, including enabling ta-C to be applied onto a graphite substrate which can be used at a high temperatures (e.g. 600° C. to 900° C.) in an oxygen-free environment in the application of pressing lenses and curved glass screens.

Accordingly, the present invention provides a substrate coated with a multi-layer coating, comprising in order:
(a) the substrate;
(b) a thermally insulating layer;
(c) an interfacial layer; and
(d) one or more layers comprising ta-C;
wherein the interfacial layer promotes adhesion of the one or more layers comprising ta-C to the thermally insulating layer.

The present invention also provides, for certain substrates (e.g. graphite), a substrate coated with a multi-layer coating, comprising in order:
(a) the substrate;
(b) an interfacial layer;
(c) one or more layers comprising ta-C; and, optionally, a seed layer between the interfacial layer and the substrate,
wherein the interfacial layer promotes adhesion of the one or more layers comprising ta-C to the substrate or if a seed layer is present promotes adhesion of the one or more layers comprising ta-C to the seed layer.

Further provided is a coating for a substrate, comprising in order:
(a) a thermally insulating layer;
(b) an interfacial layer; and
(c) one or more layers comprising ta-C;
wherein the interfacial layer promotes adhesion of the one or more layers comprising ta-C to the thermally insulating layer.

Still further provided is a coating for certain substrates (e.g. graphite), comprising in order:
(a) an interfacial layer;
(b) one or more layers comprising ta-C; and, optionally, a seed layer between the interfacial layer and the substrate,
wherein the interfacial layer promotes adhesion of the one or more layers comprising ta-C to the substrate or if a seed layer is present promotes adhesion of the one or more layers comprising ta-C to the seed layer.

Also provided is a method of coating a substrate, comprising depositing onto the substrate a coating comprising in order:
(a) a thermally insulating layer;
(b) an interfacial layer; and
(c) one or more layers comprising ta-C;
wherein the interfacial layer promotes adhesion of the one or more layers comprising ta-C to the thermally insulating layer.

The inclusion of a thermally insulating layer increases the temperature resistance of the coatings. However, it has been found that an appropriate interfacial layer is also required in order to adhere the thermally insulating layer to the top ta-C coating. In certain embodiments, for certain substrates (e.g. graphite), the insulating layer is omitted.

Thus, the invention enables coating of a substrate with a thin, hard coating that shows good wear and temperature resistance, as illustrated by the testing of embodiments of the invention described in more detail below. The coatings may be used inter alia on glass moulds for the production of asymmetric lenses or curved glass screens and on thermal printing heads.

DETAILED DESCRIPTION OF THE INVENTION

As discussed above, the term "tetrahedral amorphous carbon" (ta-C or TAC) as used herein refers to amorphous carbon having a low hydrogen content and a low $sp^2$ carbon content.

Ta—C is a dense amorphous material described as composed of disordered $sp^3$, interlinked by strong bonds, similar to those that exist in disordered diamond (see Neuville S, "New application perspective for tetrahedral amorphous carbon coatings", QScience Connect 2014:8, http://dx.doi.org/10.5339/connect.2014.8). Due to its structural similarity with diamond, ta-C also is a very hard material with hardness values often greater than 30 GPa.

For example, the ta-C may have a hydrogen content less than 10%, typically 5% or less, preferably 2% or less (for example 1% or less). The percentage content of hydrogen provided here refers to the molar percentage (rather than the percentage of hydrogen by mass). The ta-C may have an $sp^2$ carbon content less than 30%, typically 20% or less, preferably 15% or less. Preferably, the ta-C may have a hydrogen content of 2% or less and an $sp^2$ carbon content of 15% or less. The ta-C is preferably not doped with other materials (either metals or non-metals).

By contrast, the term "diamond-like carbon" (DLC) as used herein refers to amorphous carbon other than ta-C. Accordingly, DLC has a greater hydrogen content and a greater $sp^2$ carbon content than ta-C. For example, the DLC may have a hydrogen content of 20% or greater, typically 25% or greater, for example 30% or greater. The percentage content of hydrogen provided here again refers to the molar percentage (rather than the percentage of hydrogen by mass). The DLC may have an $sp^2$ carbon content of 50% or greater, typically 60% or greater. Typically, the DLC may have a hydrogen content of greater than 20% and an $sp^2$ carbon content of greater than 50%. The DLC may be undoped or doped with metals and/or non-metals.

The invention advantageously provides deposited ta-C coatings that are stable and able to maintain their high hardness and wear resistance even having been subjected to high temperatures (e.g. temperatures in excess of 500° C.).

The invention provides a substrate coated with a multi-layer coating, comprising in order:
(a) the substrate;
(b) a thermally insulating layer;
(c) an interfacial layer; and
(d) one or more layers comprising ta-C;
  wherein the interfacial layer promotes adhesion of the one or more layers comprising ta-C to the thermally insulating layer.

The uppermost layers (d) of the coating are the one or more layers comprising ta-C, and these preferably consist of ta-C. There may be several such functional layers, with Young's modulus and/or hardness remaining the same or increasing from layer to layer, peaking or culminating with the properties of an uppermost ta-C layer, usually the one exposed on the outside of the coated substrate. Preferably, the Young's modulus and/or hardness increases from layer to layer, peaking or culminating with the properties of an uppermost ta-C layer Testing e.g. of coating hardness of the coated substrate (as reported e.g. below in examples) takes place on this end product, though the Young's modulus and hardness of individual layers can also be tested or otherwise determined, e.g. theoretically or by testing an unfinished product, prior to application/deposition of further or final layer(s).

The total thickness of the one or more layers comprising ta-C is typically 2 μm or less, more typically from 0.1 μm to 1 μm, preferably from 0.1 μm to 0.7 μm and more preferably from 0.1 μm to 0.3 μm.

An aim of the invention is to provide hard coatings which are stable and able to maintain their hardness and wear resistance at high temperatures. Coated substrates of the invention preferably have a coating with a hardness of at least 2000 HV, preferably 2500 HV or more. Coatings with a wide range of measured hardness values within these ranges have been made (see examples below), including coatings with hardness values of approximately 3000 HV. Where the coating comprises more than one layer comprising ta-C, generally the ta-C layer adjacent the interfacial layer, which ta-C layer may also be referred to as being closest to the substrate, is a softer ta-C layer, enabling hardness to transition from interfacial layer through this initial ta-C layer to the uppermost, outer ta-C layer. This closest ta-C layer may have a hardness of 1000 HV or more. This provides a base for further hardness increase through to the top ta-C layer. Increase in hardness is suitably achieved by variation in the ta-C deposition parameters, e.g. when using FCVA by adjustment of substrate bias. The ta-C layer in the functional layer adjacent the interfacial layer may also have a hardness of 1200 HV or more, or 1600 HV or more.

The thermally insulating layer comprises or consists of a material that is a poor thermal conductor (e.g. having a thermal conductivity of 10 W/(m·K) or less, preferably 1.0 W/(m·K) or less when measured at a temperature of 25° C.).

Typically, the thermally insulating layer is non-metallic. Whilst the thermally insulating layer may comprise compounds of metallic elements, the thermally insulating layer does not consist of metallic elements or alloys.

Examples of suitable thermally insulating materials include silicon (Si), silicon dioxide ($SiO_2$), silicon nitride ($Si_3N_4$), titanium disilicide ($TiSi_2$), chromium silicide (CrSi), aluminia ($Al_2O_3$), aluminium nitride (AlN) and titanium aluminium nitride (TiAlN). Preferred examples include $Si_3N_4$, AlN and AlTiN. When it is desired for the coatings to be stable at temperatures in excess of 600° C. (e.g. up to 900° C.), the thermally insulating material typically is or comprises a silicon-containing compound. Examples of suitable silicon-containing compounds are silicon (Si), silicon nitride ($Si_3N_4$), titanium disilicide ($TiSi_2$) and chromium silicide (CrSi). Preferably, the silicon-containing compound is silicon nitride ($Si_3N_4$).

The total thickness of the thermally insulating layer is typically from 0.1 μm to 1 μm, preferably from 0.2 μm to 0.8 μm and more preferably from 0.3 μm to 0.7 μm. In the examples described below, the thickness of the thermally insulating layer is around 0.4 μm to 0.5 μm, and in many around 0.5 μm.

As adhesion between the thermally insulating layer and ta-C is typically poor, the coatings of the invention further comprise an interfacial layer. The interfacial layer may have a Young's modulus and/or hardness value which is intermediate between those of the thermally insulating layer and ta-C in order to promote adhesion. In this context intermediate indicates, for hardness, at least 50HV or at least 100HV increase between layers and, for Young's modulus, at least 5 or 10 increase between layers.

Additionally or alternatively, the interfacial layer will comprise a chemical element which is present in the thermally insulating layer to enhance chemical bonding between the two layers. The interfacial layer may also be formed from a carbide compound to enhance chemical bonding between the interfacial layer and the one or more layers comprising ta-C.

For example, the interfacial layer may comprise or consist of SiC, WC, TiC or mixtures thereof. When the thermally insulating layer comprises silicon (for example, where the thermally insulating layer is formed from $Si_3N_4$), the interfacial layer preferably comprises or consists of silicon carbide.

Coatings of the invention can be deposited on a wide range of substrates, and substrate choice is not in general a feature of the invention. Suitable substrates include: graphite, graphite sealed by an organic sealant, metals, alloys, steels e.g. steel, stainless steel, HSS, tool steel and alloy steel and ceramics, including e.g. $Al_2O_3$, $ZrO_2$. These substrate definitions include articles with a coating of the substrate, e.g. a mould with a graphite coating is embraced by reference to graphite as a substrate.

As discussed above, one application of the temperature resistant carbon coatings of the invention is in the production of asymmetric lenses. The inventor of the present application has found that graphite moulds coated with the coatings of the invention can be suitably used for the production of asymmetric lenses. The outermost ta-C layer is hard and therefore resistant to damage (which would result in imperfections in the glass), stable at high temperatures and does not stick to the glass during the moulding process. For this application, graphite is a preferred substrate as its shape and size is highly temperature independent.

As graphite is porous, the graphite substrate may (prior to coating), be sealed by spraying an organic sealant onto the substrate and heating in the absence of oxygen, for example up to a temperature of around 1000° C. This causes pyrolysis of the sealant which provides a cross-linked carbon structure within the sealant. Suitable organic sealants specially formulated for graphite surfaces are commercially available and known to those skilled in the art. The nature of these sealants do not form part of the present invention. This sealing process fills in any holes in the graphite and affixes graphite particles which could otherwise become loose during the coating process and also promotes adhesion of the coating to the graphite substrate.

The coating may further optionally comprise a seed layer between the substrate and the thermally insulating layer in order to promote adhesion of the thermally insulating layer to the substrate. The composition of the seed layer will depend on the composition of the substrate and the thermally insulating layer. Examples of suitable seed layers include Si, SiN, SiC, WC, TiSi, CrSi and AlN.

SiC is a preferred seed layer. When the substrate is graphite and the thermally insulating material is a silicon-containing layer, the seed layer is preferably a silicon carbide (SiC) layer.

As discussed above, a further use of the coatings of the invention is in the production of thermal heads for thermal printers. For this use, the substrate is typically a $SiO_2$-coated ceramic material. The substrate may optionally further be coated with SiC before being coated with the coatings of the invention.

The thicknesses of the interfacial layer and the seed layer are typically each from 0.05 µm to 1 µm, for example from 0.05 µm to 0.5 µm, preferably from 0.1 µm to 0.3 µm.

The total thickness of the coatings is therefore typically up to 5 µm, e.g. from 1 µm to 5 µm, preferably from 1 µm to 3 µm, most preferably from 1 µm to 2 µm.

The seed layer, thermally insulating layer and interfacial layers may be deposited by a number of PVD or CVD methods known to those in the art, but typically these layers are deposited by sputtering.

Specific coated substrates according to the invention, comprise, in order:
(a) a graphite substrate sealed with an organic sealant;
(ai) a seed layer comprising SiC and having a thickness of from 0.1 µm to 0.2 µm;
(b) a thermally insulating layer comprising $Si_3N_4$ and having a thickness of from 0.4 µm to 0.6 µm;
(c) an interfacial layer comprising SiC and having a thickness of from 0.1 µm to 0.2 µm; and
(d) one or more layers comprising ta-C having a thickness of 0.1 µm to 0.2 µm.

Other coated substrates according to the invention, comprise, in order:
(a) a graphite substrate sealed with an organic sealant;
(ai) a seed layer consisting of SiC and having a thickness of from 0.1 µm to 0.2 µm;
(b) a thermally insulating layer consisting of $Si_3N_4$ and having a thickness of from 0.4 µm to 0.6 µm;
(c) an interfacial layer consisting of SiC and having a thickness of from 0.1 µm to 0.2 µm; and
(d) one or more layers consisting of ta-C having a thickness of 0.1 µm to 0.2 µm.

Further coated substrates according to the invention, comprise, in order:
(a) a $SiO_2$ coated ceramic substrate (optionally further coated with SiC);
(ai) optionally, a seed layer consisting of SiC and having a thickness of from 0.4 µm to 0.8 µm;
(b) a thermally insulating layer consisting of $Si_3N_4$ and having a thickness of from 0.4 µm to 0.8 µm;
(c) an interfacial layer consisting of SiC and having a thickness of from 0.4 µm to 0.8 µm; and
(d) one or more layers consisting of ta-C having a thickness of 0.4 µm to 0.8 µm.

In a set of embodiments, the present invention also provides, for certain substrates, a substrate coated with a multi-layer coating, comprising in order:
(a) the substrate;
(b) an interfacial layer;
(c) one or more layers comprising ta-C; and, optionally, a seed layer between the interfacial layer and the substrate,
wherein the interfacial layer promotes adhesion of the one or more layers comprising ta-C to the substrate and if a seed layer is present this also promotes adhesion of the one or more layers comprising ta-C to the seed layer.

In these particular embodiments, the substrate preferably is or comprises graphite and the interfacial layer is preferably SiC, TiC or WC, more preferably SiC. Other optional and preferred features of these embodiments are as described elsewhere herein in relation to other embodiments of the invention, noting that for these particular embodiments the interfacial layer promotes adhesion of the one or more layers comprising ta-C to the substrate or if a seed layer is present promotes adhesion of the one or more layers comprising ta-C to the seed layer. When the interfacial layer is SiC, TiC or WC, more preferably SiC, it may act as both interfacial layer and seed layer.

Further coated substrates according to the invention, hence comprise, in order:
(a) a graphite substrate;
(ai) a seed/interfacial layer consisting of SiC and having a thickness of from 0.3 µm to 0.5 µm;
(b) a layer consisting of ta-C and having a thickness of from 0.3 µm to 0.5 µm;
(c) a second layer consisting of ta-C and having a thickness of from 0.2 µm to 0.4 µm.

Coatings of the invention may be used in a reduced oxygen environment, suitably 100 ppm $O_2$ or less, more suitably 50 ppm or less, e.g. about 10 ppm or less. Such uses apply for all substrates in general, in particular for graphite, ceramic and steel substrates, especially graphite. Suitable environments may be inert gas environments, e.g. a nitrogen or nitrogen-containing environments. Such uses may be at high temperature e.g. in excess of 500° C. and up to 1000° C.

Other coatings of the invention may be used in the presence of oxygen, e.g. in air, at high temperatures though less suitably at the higher end of the ranges above. For uses in oxygen graphite is generally a less preferred substrate.

Also provided by the invention is a method of coating a substrate, comprising depositing onto the substrate a coating comprising in order:
(a) a thermally insulating layer;
(b) an interfacial layer; and
(c) one or more layers comprising ta-C;
wherein the interfacial layer promotes adhesion of the one or more layers comprising ta-C to the thermally insulating layer.

Another method of coating a substrate, comprises depositing onto the substrate a coating comprising in order:
(a) an interfacial layer; and
(b) one or more layers comprising ta-C; and, optionally, a seed layer between the interfacial layer and the substrate,
wherein the interfacial layer promotes adhesion of the one or more layers comprising ta-C to the substrate or if a seed layer is present promotes adhesion of the one or more layers comprising ta-C to the seed layer.

As described herein the methods are useful for depositing the coatings of the invention, and the methods are further characterized by optional and preferred features of the coatings, including optional and preferred features of the thermally insulating layer, the interfacial layer and/or the one or more layers comprising ta-C.

Conventional CVD and PVD methods, specifically sputtering and CVA processes are known and used for a wide range of substrates and the methods of the invention are similarly suitable for coating a wide range of substrates.

Coatings of the invention are multilayered and the respective layers may independently be deposited using a range of known and conventional deposition techniques, including CVD, PVD, magnetron sputtering and multi-arc ion plating. Sputtering is one suitable method, especially for the intermediate layers (including the seed layer (when present), the thermally insulating layer and the interfacial layer). CVA is suitably used for the layers comprising or consisting of ta-C. The CVA process is typically a filtered cathodic vacuum arc (FCVA) process, e.g. as described below. Apparatus and methods for FCVA coatings are known and can be used as part of the methods of the invention. The FCVA coating apparatus typically comprises a vacuum chamber, an anode, a cathode assembly for generating plasma from a target and a power supply for biasing the substrate to a given voltage. The nature of the FCVA is conventional and not a part of the invention.

Hardness is suitably measured using the Vickers hardness test (developed in 1921 by Robert L. Smith and George E. Sandland at Vickers Ltd; see also ASTM E384-17 for standard test), which can be used for all metals and has one of the widest scales among hardness tests. The unit of hardness given by the test is known as the Vickers Pyramid Number (HV) and can be converted into units of pascals (GPa). The hardness number is determined by the load over the surface area of the indentation used in the testing. As examples. Martensite a hard form of steel has HV of around 1000 and diamond can have a HV of around 10,000 HV (around 98 GPa). Hardness of diamond can vary according to precise crystal structure and orientation but hardness of from about 90 to in excess of 100 GPa is common.

In describing the invention a hardness and/or Young's modulus value is given, as a value or a range of values or as a typical range of values. The value is in some cases as measured directly on the finished, coated substrate; this is apparent from the context. Hardness and/or Young's modulus of an individual layer within a multi-layer coating generally indicates the value when that layer is deposited using the given deposition conditions as a single layer on a steel substrate. If coating adhesion to the substrate is poor then the hardness and/or Young's modulus will generally indicate the hardness and/or Young's modulus of that layer deposited onto a seed layer (described herein) deposited onto the substrate. The values given accurately reflect the hardness and/or Young's modulus within the individual layers of the multi-layer coating.

The invention advantageously provides high hardness and wear and temperature resistant ta-C-based coatings.

BRIEF DESCRIPTION OF THE DRAWINGS

The invention is now illustrated with reference to the accompanying drawings in which.

EXAMPLES

Example 1

Figure 1:
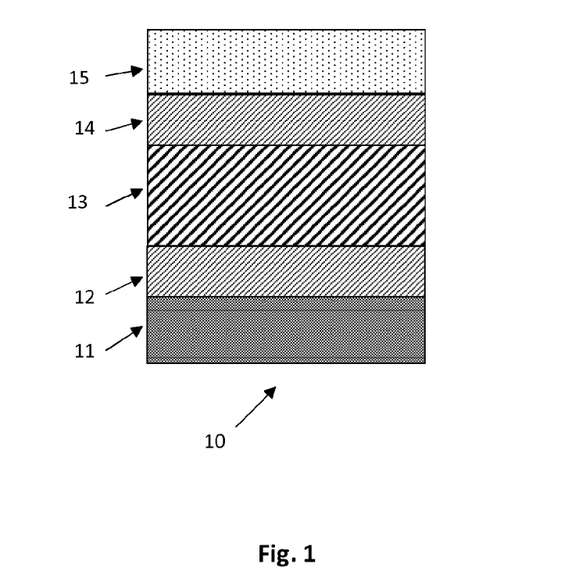
FIG. 1 shows a schematic diagram of the structure of the coating of the invention described in Example 1 (not to scale)

A first example of the coating of the invention (see FIG. 1, 10) was prepared as described below:

| Layer | Thickness |
|---|---|
| Ta-C (15) | 0.2 μm |
| SiC (14) | 0.15 μm |
| $Si_3N_4$ (13) | 0.5 μm |
| SiC (12) | 0.15 μm |
| Graphite Substrate (11) | |
| Total Thickness (determined by CAR2) | ~1 μm |

In summary, onto a sealed graphite substrate, a seed layer of SiC was sputtered, followed by subsequent layers in order of $Si_3N_4$, then SiC with the thicknesses in the tables above. Onto these intermediate layers was then deposited a ta-C coating using FCVA apparatus.

A commercially available sealant specially formulated for graphite surface (e.g. Resbond Graphite Sealer 931S-1) was sprayed onto the surface of a graphite glass lens mould and the sintered in a vacuum furnace at 1000° C. in order to seal the substrate.

Coating of the sealed graphite substrate was conducted using a large-scale ta-C coating equipment designed and manufactured by Nafeng. Firstly, the sealed graphite substrate was placed into the coating equipment chamber and the chamber was then heated and evacuated. Under vacuum, ion cleaning and ion-etching was conducted on the surface of the substrate in order to enhance adhesion with the coating. The seed layer of SiC was then deposited on the substrate by magnetron sputtering, followed by subsequent layers in order of $Si_3N_4$, and then SiC with the thicknesses in the tables above. The target material was Si and the reaction gases used were acetylene and nitrogen. After the underlying coating was completed, a layer of ta-C was deposited using FCVA coating technology.

Figure 2A:
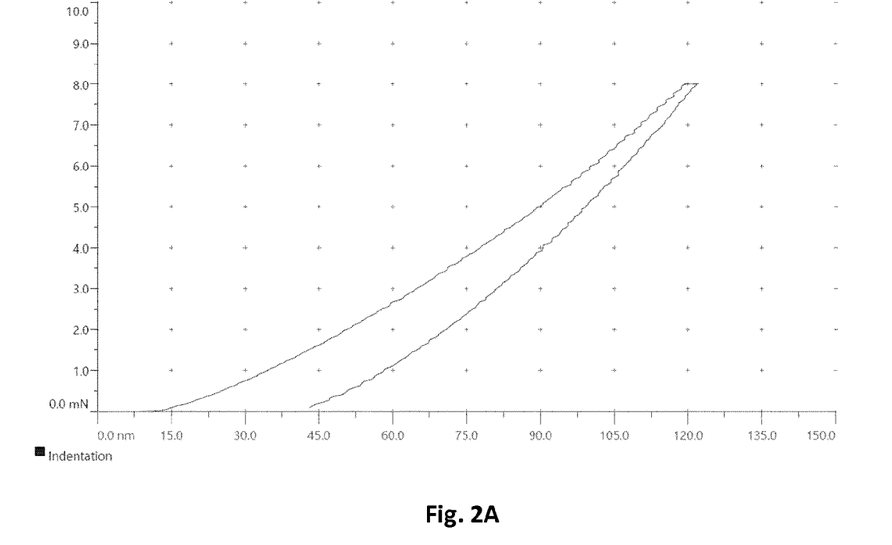
FIGS. 2A and 2B show the loading and unloading curves obtained during hardness testing of the coating of the invention described in Example 1.
Figure 2B:
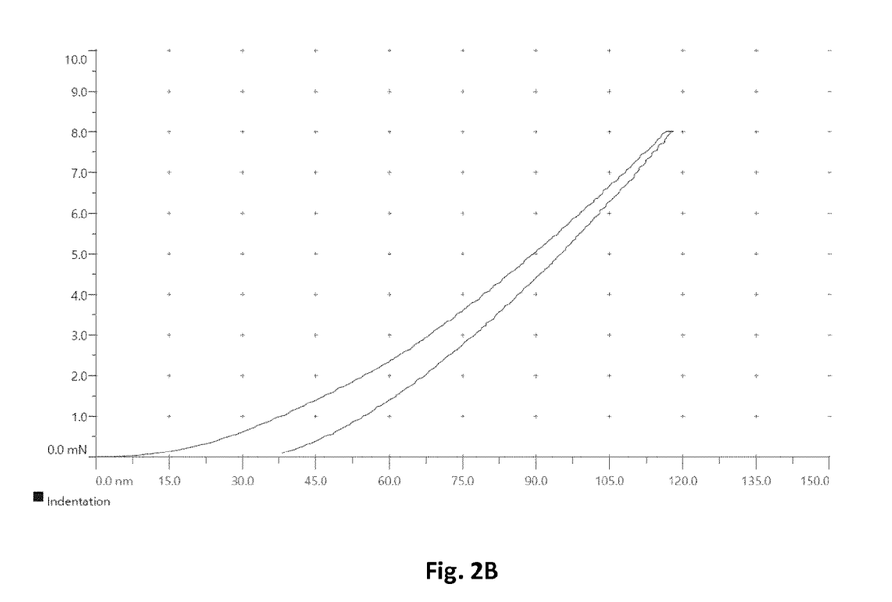

The hardness of the coating was determined by using a nanoindenter (CSM NHT2). The loading and unloading curves before and after being subjected to a temperature of 500° C. are shown in FIGS. 2A and 2B respectively. Before heating, the coating had a hardness value of 2930HV and after heating the hardness value was 3044HV. Hence, the hardness of the coatings is not impaired as a result of being subject to high temperatures.

Example 2

A second example of the coating of the invention was prepared in an analogous manner to the coating of Example 1, with the structure shown in the table below.

| Layer | Thickness |
|---|---|
| Ta-C | 0.2 μm |
| TiC | 0.1 μm |
| AlTiN | 0.5 μm |
| Substrate | |
| Total Thickness (determined by CAR2) | ~0.8 μm |

Example 3

Figure 3:
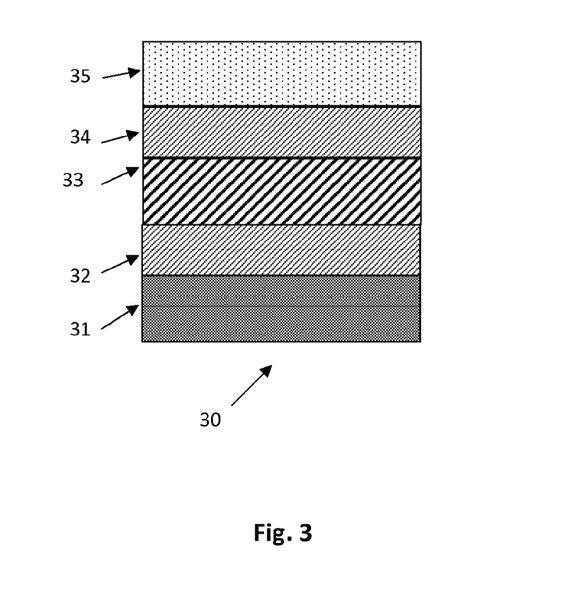
FIG. 3 shows is a schematic diagram showing the structure of the coating of the invention described in Example 3 (not to scale).

A thermal printing head was coated (see FIG. 3, 30) in an analogous manner to the coating of Example 1, with the structure shown in the table below:

| Layer | Thickness |
|---|---|
| Ta-C (35) | 0.6 μm |
| SiC (34) | 0.6 μm |
| Si$_3$N$_4$ (33) | 0.5 μm |
| SiC (32) | 0.6 μm |

Substrate - SiO$_2$-coated ceramic (with optional SiC coating) (31)

The performance of this coating was evaluated following exposure to 500° C. for two hours under atmospheric pressure.

Firstly, a sample of the coating was cut using a cross-hatch cutter (variable-length 1.5 mm$^2$ cutter). A length of 3M610 tape was then applied to the cut surface of the coating and then peeled off. No coating was peeled off by the tape and hence this coating is well adhered to the substrate.

As an indication of the wear-resistance of the coating, a Taber abrasion test was conducted on the coating, with the following conditions:

Instrument: Taber Linear Abraser TLA 5750
Abradant: CS-17 Wearaser®
Test Load: 1 kg weight
Cycle Speed: 60 cycles/min
Stroke Length: 25 mm Following 10,000 cycles, none of the substrate was exposed and no scratches were observed in the coating.

Example 4

A thermal printing head was coated in an analogous manner to the coating of Example 1, with the structure shown in the table below:

| Layer | Thickness |
|---|---|
| Ta-C | 0.6 μm |
| SiC | 0.6 μm |
| Si$_3$N$_4$ | 0.5 μm |

Substrate - SiO$_2$-coated ceramic (with optional SiC coating)

The performance of this coating was evaluated following exposure to 500° C. for two hours under atmospheric pressure and the results were comparable to those obtained in Example 3.

Example 5

A further coating of the invention was prepared as described below:

| Layer | Thickness | Hardness/HV |
|---|---|---|
| Ta-C | 0.3 μm | 3794 |
| Ta-C | 0.4 μm | 2672 |
| SiC | 0.42 μm | 1406 |
| Si$_3$N$_4$ | 0.36 μm | 1324 |
| SiC | 0.42 μm | 1406 |

Substrate - Graphite
Total thickness ≈ 1.9 μm

This coating was subjected to our internal tests. This coating passed our cross hatch test. The coating was also subjected to our internal steel wool test (1 kg, 60 ms$^{-1}$, 17 mm) and our internal wear test (2 kg, 10 minutes). Again, the coating passed both of these tests.

A further test was carried out according to VDI standard 3198 with a load of 60N. This coating was found to fall into the HF-2 quality class since there was no peel off but some scratches after completion of the test.

Example 6

A further coating of the invention was prepared as described below:

| Layer | Thickness | Hardness/HV |
|---|---|---|
| Ta-C | 0.3 μm | 3794 |
| Ta-C | 0.4 μm | 2672 |
| SiC | 0.4 μm | 1406 |

Substrate - Graphite
Total thickness ≈ 1.1 μm

This coating was subjected to our internal tests. This coating passed our cross hatch test. The coating was also subjected to our internal steel wool test (1 kg, 60 ms$^{-1}$, 17 mm) and our internal wear test (2 kg, 10 minutes). Again, the coating passed both of these tests.

A further test was carried out according to VDI standard 3198 with a load of 60N. This coating was found to fall into the HF-1 quality class since there was no peel off and no scratches after completion of the test.

As can be seen in the Examples above, coatings of the invention are stable and maintain their hardness upon exposure to high temperatures.

The invention claimed is:
1. A coated substrate with a multi-layer coating, the coated substrate comprising in order:
   (a) the substrate;
   (b) a seed layer comprising SiC;
   (c) a thermally insulating layer comprising Si$_3$N$_4$;
   (d) an interfacial layer comprising SiC; and
   (e) one or more layers comprising ta-C;
   wherein the interfacial layer promotes adhesion of the one or more layers comprising ta-C to the thermally insulating layer.
2. A coated substrate according to claim 1, wherein the one or more (e) layers consist of ta-C.
3. A coated substrate according to claim 1, wherein the thermally insulating layer has a thickness of from 0.2 μm to 1 μm.

4. A coated substrate according to claim 1, wherein the one or more layers comprising ta-C have a total thickness of from 0.1 µm to 1 µm.

5. A coated substrate according to claim 1, wherein the coating has a total thickness of from 1 µm to 5 µm.

6. A coated substrate according to claim 1, wherein the substrate comprises graphite.

7. A coated substrate according to claim 1, wherein the coating has a hardness of at least 2000HV.

8. A coated substrate according to claim 1, wherein the coating comprises two or more layers comprising ta-C, optionally wherein the hardness of each layer comprising ta-C increases from the layer comprising ta-C adjacent the interfacial layer to the outermost layer of ta-C.

9. A coated substrate according to claim 1, wherein:
(a) the substrate is graphite sealed with an organic sealant;
(b) the seed layer comprises SiC and has a thickness of from 0.1 µm to 0.2 µm;
(c) the thermally insulating layer comprises $Si_3N_4$ and has a thickness of from 0.4 µm to 0.6 µm;
(d) the interfacial layer comprises SiC and has a thickness of from 0.1 µm to 0.2 µm; and
(e) the one or more layers comprising ta-C have a thickness of 0.1 µm to 0.2 µm.

10. A coated substrate according to claim 1, wherein:
(a) the substrate is $SiO_2$ coated ceramic;
(b) the seed layer consists of SiC and has a thickness of from 0.4 µm to 0.8 µm;
(c) the thermally insulating layer consists of $Si_3N_4$ and has a thickness of from 0.4 µm to 0.8 µm;
(d) the interfacial layer consists of SiC and has a thickness of from 0.4 µm to 0.8 µm; and
(e) the one or more layers consisting of ta-C have a thickness of 0.4 µm to 0.8 µm.

11. A method of making a coated substrate according to claim 1, comprising depositing onto the substrate a coating comprising in order:
(a) a seed layer comprising SiC;
(b) a thermally insulating layer comprising $Si_3N_4$;
(c) an interfacial layer comprising SiC; and
(d) one or more layers comprising ta-C;
wherein the interfacial layer promotes adhesion of the one or more layers comprising ta-C to the thermally insulating layer.

12. A coated substrate according to claim 1, wherein the thermally insulating layer has a thermal conductivity of 10 W/(m,K) or less when measured at a temperature of 25° C.

13. A coated substrate according to claim 1, wherein the interfacial layer has a thickness of from 0.05 µm to 0.3 µm.

14. A coated substrate according to claim 1, wherein the thermally insulating layer consists of $Si_3N_4$.

* * * * *